United States Patent [19]
Freedman et al.

[11] Patent Number: 5,495,089
[45] Date of Patent: Feb. 27, 1996

[54] LASER SOLDERING SURFACE MOUNT COMPONENTS OF A PRINTED CIRCUIT BOARD

[75] Inventors: Gary M. Freedman, Stow; Maurice P. Brodeur, Concord, both of Mass.; Peter J. Elmgren, Hampstead, N.H.

[73] Assignee: Digital Equipment Corporation, Maynard, Mass.

[21] Appl. No.: 71,557

[22] Filed: Jun. 4, 1993

[51] Int. Cl.$^6$ .................................................. B23K 26/00
[52] U.S. Cl. ............................... 219/121.64; 219/121.61; 29/840
[58] Field of Search ........................... 219/121.6, 121.63, 219/121.64, 121.85; 29/840; 228/180.2

[56] References Cited

U.S. PATENT DOCUMENTS

| | | | |
|---|---|---|---|
| 4,792,658 | 12/1988 | Langhans et al. | 219/121.63 |
| 4,854,320 | 8/1989 | Dew et al. | 219/121.61 |
| 4,979,290 | 12/1990 | Chiba | 219/121.63 |
| 5,008,512 | 4/1991 | Spletter et al. | 219/121.64 |
| 5,193,738 | 3/1993 | Hayes | 228/180.2 |

FOREIGN PATENT DOCUMENTS 3248787  11/1991  Japan.

*Primary Examiner*—Tu Hoang
*Attorney, Agent, or Firm*—Mark J. Caseu; Denis G. Maloney; Arthur W. Fisher

[57] ABSTRACT

This disclosure relates to a process for laser soldering surface mount components on a printed circuit board using the continuous wave laser scanning technique. The process involves factoring together the scan rate, the beam diameter, and the laser power level, in order to determine what these specific process variables should be. In addition, the process also involves taking account of the depth of a metallic layer, such as a reference plane, inside the printed circuit board to determine its effect on other process variables. On the other hand, if the board does not have a metallic layer, the process takes account of the thickness of the board being processed. Preferred ranges for process variables are identified, as well as optimization techniques which further refine the process variables to achieve production efficiency or bonding pull strength.

24 Claims, 3 Drawing Sheets

LASER SOLDERING SURFACE MOUNT COMPONENTS OF A PRINTED CIRCUIT BOARD

FIELD OF THE INVENTION

This invention relates to a process for performing single sweep, continuous wave, laser bonding of surface mount components onto a substrate, such as a printed circuit board.

BACKGROUND OF THE INVENTION

There are a number of different ways by which integrated circuit ("IC") devices may be bonded to a printed circuit board using localized techniques, such as thermo-compression bonders, so called hot bars, or lasers. The ultimate objective of any bonding approach is to insure that a reliable physical and electrical connection is formed between the leads, which are connected to or formed with the device, and the contact pads, which are integrally formed with the board.

Certain difficulties are encountered using devices such as thermo-compression bonders or hot bars when the board involved in the bonding process includes a reference plane within the substrate. More specifically, when one attempts to perform localized, surface mount bonding using such devices the reference plane within the substrate, which has a very large mass relative to the contact pads, operates as a thermal sink tending to draw heat away from the lead/pad combinations to be bonded. This is especially so when the reference plane is close to the surface, or when the pad is connected to the plane by means of a via. Consequently, the teaching in the bonding art suggests that the presence of the reference plane will tend to interfere with the use of localized bonding techniques. To address this problem, the use of thermo-compression bonders and hot bars typically require the raising of the temperature of the substrate and the reference plane, by pre-heating for example, in order to successfully accomplish bonding. This, of course, makes for a more involved bonding process.

Laser bonding has been found to produce more reliable lead/pad joint formation and has tended to provide higher product yields relative to other approaches. One such laser bonding approach is single point bonding, involving the use of a pulsed beam. A pulsed beam is one which either actually or effectively turns on and off during operation. In single point bonding the laser is positioned so that the beam will be directed at a single lead/pad combination and irradiated to effect reflow of adjoining metals. After a certain interval the transmission of the beam is stopped, and the board and laser are then repositioned relative to one another so that the next lead/pad combination can be irradiated. After irradiation, the melted solder of the first lead/pad combination solidifies to form the bond.

One drawback to the single point bonding technique is that a very small beam spot size is required, which is technically difficult to achieve and maintain. Secondly, the beam that is emitted by the laser must be precisely positioned relative to the lead/pad combination so that the beam is directed at only one lead/pad combination at a time. Furthermore, the beam alignment must be precise so that the spot irradiates only the lead/pad combination, and not the section of the board that lies in between adjoining lead/pad combinations. This is to avoid burning the board with the high energy density beam characteristic of finely focused laser output. Finally, it is also technically difficult to achieve pulse to pulse stability in the single point bonding approach.

A different laser bonding approach is single pass, continuous wave bonding, hereinafter referred to simply as "CW" scanning. Through this technique the laser beam is continuously emitted as the beam scans around the lead/pad combinations of the component positioned on the board. Such beam scanning can be accomplished by the movement of the board relative to a stationary laser beam, or the movement of the beam relative to a stationary board.

Unlike the single point bonding approach, in CW scanning the laser does not effectively turn on and off. Instead, the laser beam remains on throughout the time that it is directed at the leads of a given component. Consequently, during the operation of the CW scanning system, portions of the board between adjoining lead/pad combinations will necessarily be irradiated by the laser.

In processing boards using CW scanning, the irradiation of the lead/pad combinations and, consequently, the board requires the consideration of a number of important factors. Firstly, during CW scanning the laser must irradiate the lead/pad combinations for a long enough period of time to effect reflow of lead/pad solder, which ultimately solidifies to form a joint. Although it may be desirable to prolong the duration of the irradiation of the lead/pad combination or use a high powered beam, in order to insure the necessary reflow, such an approach may cause the board to be thermally damaged during the process. Additionally, any delay of the movement of the beam, beyond that which is necessary to cause reflow, has an impact on the efficiency of the board processing operation.

Efficient and successful CW scanning therefore requires the understanding of the effect of the various factors that influence the success of the process. Accordingly, it is desirable to have a delineation of the CW scanning process factors, and a method of using those factors for the CW scanning of printed circuit boards.

SUMMARY OF THE INVENTION

This invention relates a CW scanning process, as opposed to single point laser bonding process, for bonding the conductive elements of a surface mount electrical component to the corresponding conductive elements on a printed circuit board. One embodiment of the process involves irradiating a conductive element with a laser beam which is emitted by a continuous wave laser, where the power level of the laser, the beam diameter of the laser beam, and scan rate used during irradiation have all been factored together to determine what the specific values for each should be during the irradiation process. Other embodiments of the invention factor into the process the depth of a metallic layer, if any, in the printed circuit board, or alternatively the thickness of the printed circuit board.

In another embodiment of the invention, the bonding process involves irradiating a conductive element, with a continuous wave laser, where the scan rate at which the laser moves has been determined on the basis of such factors as the power level of the laser, the diameter of the laser beam, and the depth of a metallic layer within the printed circuit board.

An object of the present invention is to define the parameters for and the method of implementing a process for achieving successful and efficient laser bonding. Those parameters include the laser power level, beam diameter, laser scan rate, the depth of a metallic layer, if any, and the thickness of the circuit board. A feature of the invention is to effectively use such factors in the form of mathematically stated relationships and process ranges. An advantage of the invention is that it provides a complete, well defined process which can be followed to effect surface mount bonding.

Other objects, features, and advantages of the invention will be further appreciated and better understood upon consideration of the following detailed description of the preferred embodiment, presented in conjunction with the accompanying drawings.

DETAILED DESCRIPTION OF THE PREFERRED EMBODIMENT

Figure 1:
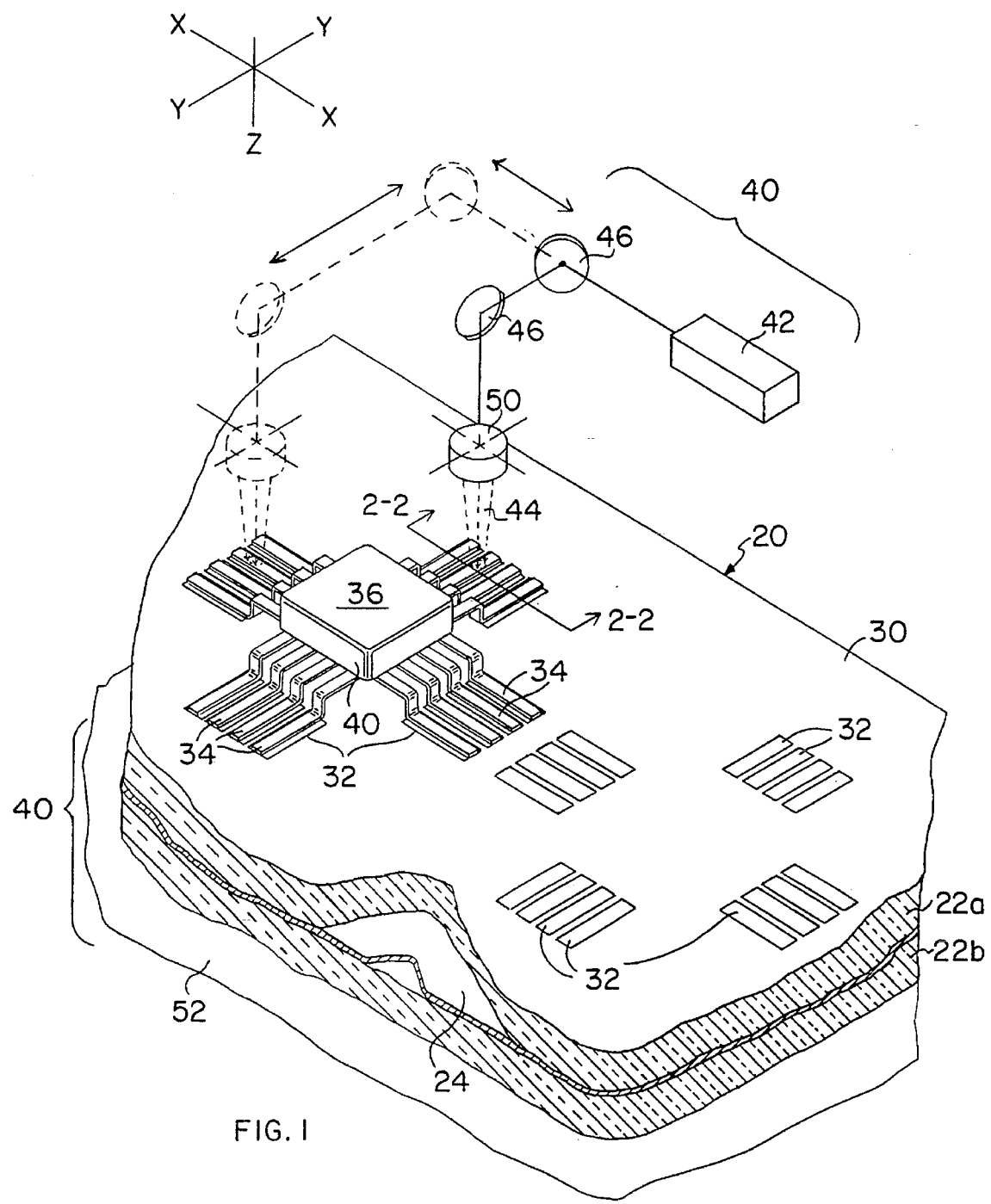
FIG. 1 is a partly sectioned, isometric view of a integrated circuit device being laser bonded on a printed circuit board by means of a laser bonding process which is consistent with an embodiment of the method of the present invention.

FIG. 1 provides an isometric view of the types of components and equipment involved in the preferred embodiment of the laser bonding process. In particular, printed circuit board 20, shown in fragmentary view, is comprised of multiple layers of a substrate, which can be glass fiber reinforced polyimide, thin film polyimide, or glass reinforced epoxy, such as FR-4. In FIG. 1 board 20 is shown to include two substrate layers 22a, 22b. Additionally, board 20 includes a metallic layer, such as reference plane 24, a flat portion of which is visible in FIG. 1 due to the partial sectioning of board 20. Plane 24 is commonly comprised of copper, and can serve as a grounding plane, a reference voltage plane, or a plane which shields the board against electro-magnetic flux. Plane 24 is positioned a given distance, or depth, from the surface 30 of board 20.

Although in FIG. 1 board 20 is shown to have only two substrate layers 22a, 22b and one plane 24, other boards which have a greater number of dielectric layers and reference planes are suitable for processing with the method described in this detailed description. Additionally, the method of laser soldering may be applied to printed circuit boards which have no reference plane within the substrate, as described below.

Board 20 has a plurality of contact pads 32 positioned thereon. Pads 32 are conductive elements on the surface 30 of board 20 and, as will be discussed below, pads 32 are electrically coupled to other circuitry, such as plane 24, within board 20. Pads 32 are generally formed of a conductive metal, such as copper, and they may have a solder coating, typically comprised of a tin/lead composition that is at the eutectic (63% tin/37% lead by weight), or near the eutectic. Some such coatings on pads 32 are in the form of a so-called "solder dome" which forms a generally semispherical cap on each pad 32 and which are shown as reference number 62 in FIG. 2. In FIG. 1 a number of pads 32 are shown in the foreground of the illustration, while the view of the more remotely positioned pads 32 is somewhat obstructed due to the fact that they are covered by the leads 34 of device 36.

Still referring to FIG. 1, device 36 is shown to have a plurality of like configured leads 34 extending outwardly from the periphery of the device or the device housing 40. Each lead 34 is formed, or bent, at two, approximate, right angles so that the bent sections at either end of lead 34 are generally parallel to one another and, when viewed from the side, lead 34 appears to be shaped like a gull wing.

Although device 36 is shown to have only four leads 34 per side, it will be known to those skilled in the art that modern IC devices have many more than sixteen leads extending around the device, often hundreds. Only four per side are shown so that the features of leads 34, pads 32, and board 20 can be shown in enlarged view for purposes of drawing clarity. The preferred embodiment of the laser bonding process, however, is suitable for use with IC devices having any number of leads. Additionally, it has been found that the bonding process is not particularly sensitive to the actual size or dimension of leads 34 or pads 32.

Leads 34 are conductive elements coupled with the internal circuitry of device 36. Leads 34 are generally formed of a conductive metal, such as Alloy 42 or copper, and are coated with a solderable material, such as tin, or tin/lead. Some lead/pad combinations are designed such that both are covered with solder coating, while other such combinations have either the lead or the pad, but not both, coated with solder.

During the laser bonding process leads 34 are typically bonded with pads 32, such that the lead/pad combinations form the physical and electrical connections between the circuitry of board 20 and device 36. In order to accomplish such bonding, device 36 is positioned relative to board 20 so that corresponding leads 34 and pads 32 are properly positioned relative to one another. This could be accomplished either manually, or automatically such as by means of a robot. FIG. 1 includes an illustration of one such device 36 mounted with leads 34 positioned for bonding to corresponding pads 32.

As mentioned, the fragmented portion of board 20 shown in FIG. 1 includes one set of pads 32, which are completely exposed, while a second set of pads 32 are only partially visible due to the fact that device 36 with its extending leads 34 have been positioned over the pads 32. Corresponding leads 34 and pads 32 form the individual lead/pad combinations that are to be bonded together by means of a CW scanning process.

FIG. 1 further shows certain components of laser system 40. Laser system 40 includes laser 42, shown in block diagram form, which in the preferred embodiment is a Nd:YAG laser which emits a stable, multimode (near Gaussian shaped) beam 44 having a 1.06 micrometer wavelength. Laser 42 has an adjustable power level and beam diameter. Additionally, laser 42 has an adjustable scan rate, meaning the rate at which beam 44 is made to move relative to the object it irradiates. One such commercially available laser which has been found to be suitable for this particular application is the Baasel Laser BLS-600, which is made by Baasel LASERtech of Petersbrunner Strasse 1B, Starnberg, 8130, Germany.

In the preferred embodiment, beam 44 is collimated and expanded before input to the final objective. As shown in FIG. 1, beam 44 is reflected off orthogonally mounted mirrors 46, which are coated for maximum reflection of a 1.06 micrometer beam at 45°. Beam 44 is focused through final objective lens 50 such that beam 44 is delivered by laser system 40 at an angle which is normal (90°) relative to board 20. Lens 50 preferably has a long focal length, such as a focal length of 100 millimeters or more, for example. Through the adjustment of the position of lens 50 the size of the beam diameter can be adjusted.

In practice, the actual size of the beam diameter is determined and set using a commercially available beam diameter monitor, such as the BeamScan model 1180-FIR available through Photon, Inc. 970 University Ave., Los Gatos, Calif., 95030. Likewise, in actual practice, the power level of laser 42 is determined and set using a beam power monitor, such as the Labmaster with a LM100 measuring head, available through Coherent Components Group, 2301 Lindbergh St., Auburn, Calif. 95603.

In FIG. 1 portions of laser system 40 are shown in phantom lines to imply that the relative position of laser system 40 and board 20 will change during the laser bonding process. In the preferred embodiment, the positioning of a given device 36 relative to the beam delivery components of laser system 40 is first accomplished by performing a gross position adjustment of board 20 by means of an X-Y platform 52, which is included in laser system 40. Platform 52, which is operated under the direction of a computer (not shown), is capable of moving in the X-Y direction relative to the axis key provided on FIG. 1, which in most applications describes planar movement in the generally horizontal direction. As platform 52 moves, it will position various components on board 20 under the beam delivery elements of laser 40 so that all such components, such as device 36, can be processed through the beam scanning operation. Once this gross adjustment is achieved, laser system 40 performs CW scanning of beam 44 so that all of the lead/pad combinations of the given component are irradiated sequentially while board 20 remains stationary.

In the preferred embodiment of the laser bonding process, laser system 40 is used for CW scanning, such that beam 44 is constantly emitted as it continuously sweeps around the general periphery of device 36. Thus, beam 44 irradiates not only the lead/pad combinations, but also the portions of board 20 which lie between adjacent lead/pad combinations. As a consequence of the irradiation of the portions of board 20 between the lead/pad combinations, and because of the variability in their optical absorption properties, it is recommended that the use of solder masks between pads 32 should be avoided. Alternatively, if a solder mask is used, it should be applied beyond the beam impingement area.

During the actual laser beam irradiation of the leads 34 and pads 32, device 36 may be held in place by means of a hold-down fixture. A suitable hold down fixture is detailed in U.S. Pat. No. 5,175,410 issued Dec. 29, 1992 to Freedman, et al. The purpose of such a hold-down fixture is to insure that device 36 remains in place during the bonding operation, and that leads 34 are pressed in intimate contact with pads 32, This insures that when beam 44 irradiates the lead/pad combinations the reflowing solder forms a satisfactory bond when the molten solder solidifies.

If a hold down fixture which has an aperture for the laser beam to pass through is used, the aperture should be large enough so that it does not impair the beam delivery. One form of impairment could occur if the aperture is so narrow that it significantly "clips" the beam. On the other hand, it has been found that with certain fixture apertures some marginal clipping can occur without necessarily impairing the bonding process.

Figure 2:
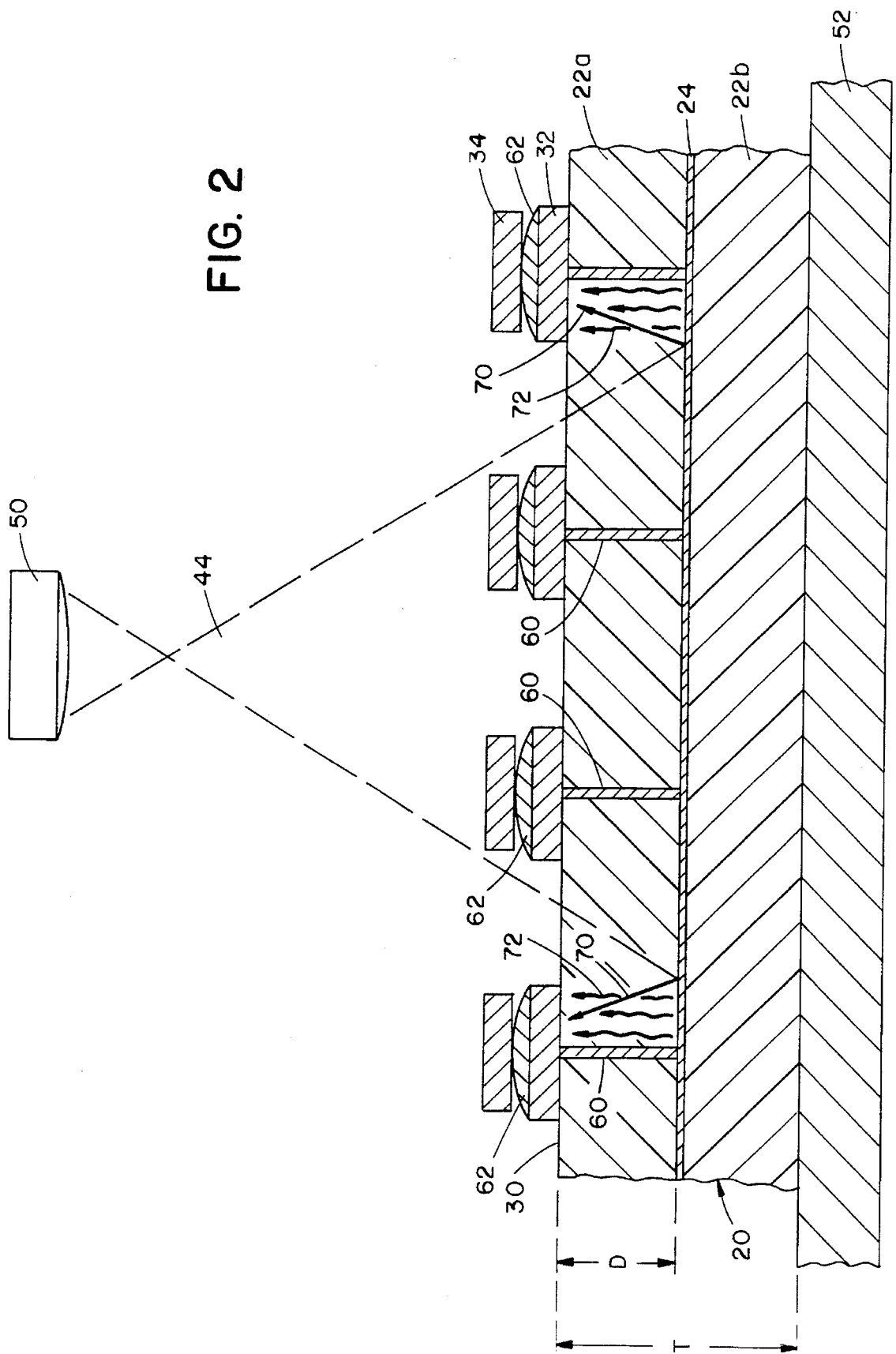
FIG. 2 is a sided view of the device and board in FIG. 1, sectioned along the reference line 2—2.

Referring now to FIG. 2, a side sectional and fragmented view of device 36 and board 20 is provided. More precisely, the view in FIG. 2 is the result of sectioning lead/pad combinations along the reference line 2—2, shown on FIG. 1, and looking at the sectioned portion from the side. Through this view, the substrate layers 22a, 22b of board 20 are shown with plane 24 positioned between them. Additionally, from the side view, each pad 32 is shown to be electrically coupled to plane 24 by means of a conductive via 60. Although FIG. 2 shows each pad 32 to be coupled to plane 24 by means of vias 60, actual printed circuit boards will not have every pad 32 so connected. The absence of such a connection between certain pads 32 and plane 24, however, has not been found to have any appreciable effect on the bonding parameters. In the particular embodiment shown on FIG. 2, each pad 32 has a solder dome 62 on its top surface, and positioned above dome 62 is the side sectioned view of leads 34.

In FIG. 2, beam 44 is shown to be principally directed at lead 34. In other embodiments, beam 44 could be principally directed at pad 32, provided pad 32 extends beyond the overlaid lead 34. An example of such a bonding approach is shown in US Pat. No. 4,926,022, entitled "Laser Reflow Soldering Process and Bonded Assembly Formed Thereby", issued 15 May 1990 to Freedman. Accordingly, although FIGS. 1 and 2 tend to show only lead 34 being directly irradiated by beam 44, it should be understood that either lead 34 or pad 32 could be directly irradiated in accordance with the bonding process.

The particular embodiment shown in FIG. 2 introduces the variables "D" and "T". In this detailed description, D is used to represent the depth of plane 24 from the surface of board 20 on which beam 44 is directed during a given laser bonding operation. T, on the other hand, is used to represent the thickness of a board, as will be detailed below.

Also in FIG. 2, a number of reflection lines 70 and radiation lines 72 are also shown. This is intended to illustrate that when beam 44 is directed at the lead/pad combinations, and continuously scanned around as described above, portions of beam 44 will penetrate substrate layer 22a and be reflected and/or re-radiated off of plane 24 and onto the underside of pad 32. It has been found that with a plane 24 positioned within board 20, a secondary effect of irradiating the lead/pad combinations using the CW scanning technique, is that beam 44 will reflect and re-radiate off of plane 24. Furthermore, the reflected and re-radiated energy will appreciably contribute to the heating of pad 32 in order to cause the solder reflow which eventually forms a joint.

This particular finding is somewhat counter to the more traditional teaching which tended to focus upon the hindering effect plane 24 has on the use of localized bonding techniques. Instead of plane 24 operating as a thermal sink which draws heat away from the lead/pad combinations, it actually works as an energy reflector/radiator which assists in the reflow process. Furthermore, as a result of the discovery of this secondary effect, in certain embodiments of the laser bonding process the reflected and radiated energy of beam 44 can be factored together with other significant process parameters to define the particulars of the bonding technique.

Having discussed the general environment in which CW scanning is practiced, consideration can now be given to the discovered relationship between a number of variables in the process. Additionally, further details can now be given to describe alternate embodiments of the process by which these variables are factored together to define a process for efficiently and successfully accomplishing laser soldering.

The key process parameters which may be factored into the various embodiments of the bonding process are shown in Table A.

TABLE A

P=Power level of laser 42, measured in watts;

B=Diameter of beam 44, measured in inches at the $1/e^2$ level;

S=Scan rate of beam 44 relative to the lead/pad combinations measured in inches per minute;

D=Depth of plane 24 from the surface of board 20, measured in inches; and

T=Thickness of board, not having a reference plane, measured in inches.

In actual implementations of the bonding process the depth of the reference plane and the board thickness are variables over which there may not be any effective control. In other words, in different implementations of the process D or T are variables which are taken account of, but are accepted as givens which must be accommodated by the other variables in the process.

On the other hand, the power level and the beam diameter are adjustable, as discussed above. Although both P and B are adjustable, in practical implementations of the process, both of these variables are more difficult to adjust than the scan rate, S. Therefore, it has been found that it is more practical to first select P and B, within the preferred ranges discussed below, and then determine the S in accordance with the process further described herein.

Figure 3:
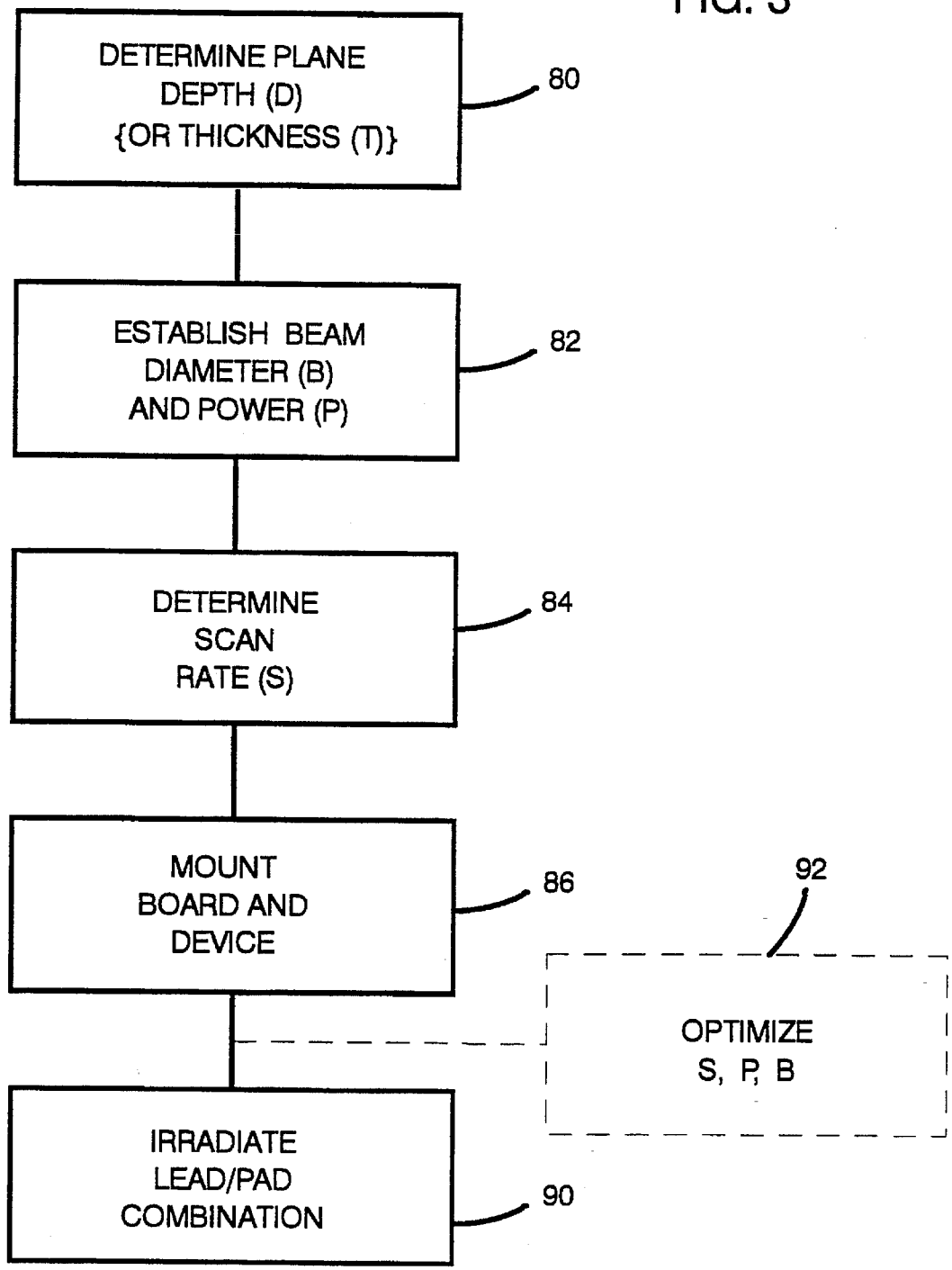
FIG. 3 is a flow diagram showing the process steps of an embodiment of the present invention.

In the preferred embodiment of the invention, a mathematical formula is used to define the relationship between the scan rate, the beam diameter, the laser power, and either the reference plane depth, if the board has one, or the board thickness, if there is no reference plane. FIG. 3 provides a flow diagram which illustrates the process by which these variables are factored together.

Referring now to FIG. 3 a flow diagram is provided to show the preferred embodiment of the method by which device 36 is laser bonded to board 20. As described, the method is applied to boards 20 that are made of multiple layers of glass fiber reinforced polyimide, thin film polyimide, or glass reinforced epoxy, such as FR-4. Additionally, board 20 includes plane 24 positioned a given depth, D, from the surface of board 20 on which device 36 is being bonded. In the preferred embodiment of the process, the power level of laser 42 is set in the range of 12–20 watts, and the diameter of beam 44 is set in a range from 0.060–0.080 inches.

In FIG. 3, the process commences with the determination of D, the depth of plane 24 from the surface of board 20 in inches (Step 80). In step 80 the block refers to the alternate determination of "T", the purpose of which will be further discussed below. Still referring to the flow diagram, the beam diameter, B, and the power level, P, are selected (Step 82), both of which are set within the ranges stated above by an operator (not shown) of laser system 40. Having determined D, B, and P, the method next uses this information for the purpose of determining the scan rate, "S", in inches/minute. In the preferred embodiment, S is next determined (Step 84) by reference to the following equation:

$$S=-1777.78B^2+113.89B+0.87P-191.43D+2.96 \qquad \text{(Equation I)}$$

Accordingly, using Equation I an operator of laser system 40 can determine what scan rate should be programmed into the laser system 40 for the movement of beam 44 relative to lead/pad combinations.

In an alternate application of the process, a given board may not have a reference plane within the substrate, like those shown in FIGS. 1 and 2. Nonetheless, a board without a reference plane can be processed using the above referenced method, provided that in Equation I the thickness of the board (T), measured in inches, is substituted in place of the depth of the plane D. Referring back to step 80 in FIG. 3, if the board being processed does not have a reference plane then the process commences with the determination of the board thickness, T (step 80). After the determination of T, B and P are selected from the ranges discussed above in connection with step 82. Then S is determined, in this instance by using the following equation:

$$S=-1777.78B^2+113.89B+0.87P-191.43T+2.96 \qquad \text{(Equation II)}$$

After S is determined, the flow diagram progresses in the same manner whether or not the printed circuit board includes a reference plane. Still referring to FIG. 3, after programming S into laser system 40, the flow diagram next shows that board 20 is mounted on platform 52 and device 36 is mounted and secured on board 20 such that leads 34 are properly aligned and in contact with pads 32 (Step 86). In such laser bonding processes, it is typical to treat the lead/pad combinations with a solder flux, such as Alpha 100 sold by Alpha Metals of Jersey City, N.J. As will be clear to those skilled in the art, the sequence of when board 20 and device 36 are positioned, relative to the computations performed in the other process steps, is not critical. In other embodiments of the process, board 20 and device 36 may be positioned before the other process steps are performed.

With board 20 and device 36 so positioned, and with S programmed into laser system 40, the process may next be continued with laser 42 irradiating the lead/pad combinations using CW scanning at the established power, beam diameter, and scan rate values (Step 90).

Still referring to FIG. 3, in the preferred embodiment of the invention, before actually irradiating the lead/pad combinations the operator can use the specific power level, beam diameter, and scan rate values as the basis for process optimization. For example, these parameters in the CW scanning process can be optimized for processing throughput or the pull strength of the lead/pad combinations, or both. Such optimization techniques are disclosed in *Statistics for Experimenters* by George Box, William Hunter, and J. Stuart Hunter, John Wiley & Sons, Inc. (1978). Alternatively, applications of an optimization technique can be implemented using commercially available software packages, such as "RS/1", version 4.3 (1990) distributed by Bolt, Beranek, and Newman, Inc. of 10 Fawcett Street, Cambridge, Mass., 02138, for example. Accordingly, in FIG. 3 the optional step of optimizing the bonding parameters in accordance with known techniques is illustrated by having that step shown in the flow diagram in dashed lines (Step 92).

Although the embodiments of the laser bonding process have focused upon the application of the process to boards that appear to have electrical components, such as device 36, mounted on only one side, the process is also applicable to boards which have components mounted on two sides, provided the material composition of the board is as described above. Accordingly, the invention in its broader aspects is not limited to the specific details, representative apparatus, and illustrative examples shown and described herein. Thus, departures may be made from such details without departing from the spirit or scope of the invention.

What is claimed is:

1. A method of laser bonding comprising the steps of:
   irradiating a first conductive element, which is in contact with a second conductive element, with a continuous wave laser beam characterized by a power level (P), a beam diameter (B) and a scan rate (S) at which said beam moves relative to one of said first and second conductive elements;

determining at least one of said power level, said beam diameter and said scan rate using an equation having a form $$S=aB^2+bB+cP+dT+e$$

where "a", "b", "c", "d", and "e" have predetermined values, and "T" represents a thickness of a substrate on which one of said first and second conductive elements is mounted.

2. The method in accordance with claim 1, wherein said substrate comprises a printed circuit board comprising dielectric material.

3. The method of claim 1, wherein the equation is generally in the form:

$$S=-1777.78B^2+113.89B+0.87P-191.43T+2.96$$

4. A method of laser bonding a first conductive element and a second conductive element disposed in contact with said first conductive element and on a mounting surface of a substrate, said substrate comprising a conductive plane and a dielectric layer disposed between said conductive plane and said mounting surface, said method comprising the steps of:
  irradiating said first and second conductive elements with a continuous wave laser beam characterized by a power level (P), a beam diameter (B) and a scan rate (S) at which the beam moves relative to one of said first and second conductive elements;
  determining at least one of said power level (P), said beam diameter (B) and said scan rate (S) using an equation having a form $$S=aB^2+bB+cP+dD+e$$

where "a", "b", "c", "d", and "e" have predetermined values, and "D" represents a distance between said conductive plane and said mounting surface of said substrate.

5. The method in accordance with claim 4, wherein said substrate comprises a printed circuit board, and said conductive plane comprises a voltage reference plane.

6. The method of claim 4, wherein the equation is generally in the form:

$$S=-1777.78B^2+113.89B+0.87P-191.43D+2.96$$

7. A method of laser bonding a first conductive element and a second conductive element disposed in contact with said first conductive element and on a mounting surface of a substrate having a thickness (T), comprising the steps of:
  irradiating said first conductive element, which is in contact with said second conductive element, with a continuous wave laser beam characterized by a plurality of parameters including a power level (P), a beam diameter (B) and a scan rate (S) at which said beam moves relative to one of said first and second conductive elements;
  determining at least one of said beam diameter (B), said power level (P) and said scan rate (S) using a functional relationship between at least one of said parameters and said substrate thickness (T).

8. The method of claim 7, wherein said step of determining at least one of said power level (P), said beam diameter (B) and said scan rate (S) comprises the step of using an equation having a form $$S=aB^2+bB+cP+dT+e$$

where "a", "b", "c", "d", and "e" have predetermined values.

9. The method in accordance with claim 7, wherein further said substrate comprises a printed circuit board comprising dielectric material.

10. The method of claim 7, wherein said functional relationship is generally in the form:

$$S=-1777.78B^2+113.89B+0.87P-191.43T+2.96$$

11. The method of claim 7, wherein said step of determining at least one of said beam diameter (B), said power level P and said scan rate (S) includes the step of using a linear relationship between said scan rate (S) and said substrate thickness (T).

12. The method of claim 7, wherein said step of determining at least one of said beam diameter (B), said power level (P) and said scan rate (S) includes the step of using a linear relationship between said power level (P) and said substrate thickness (T).

13. The method of claim 7, wherein said step of determining at least one of said beam diameter (B), said power level (P) and said scan rate (S) includes the step of using a quadratic formula expressing said substrate thickness (T) in terms of said beam diameter (B).

14. The method of claim 7, wherein said step of determining at least one of said beam diameter (B), said power level (P) and said scan rate (S) includes the step of using a formula expressing said scan rate (S) as a quadratic function of said beam diameter (B), and a linear function of said power level (P) and said substrate thickness (T).

15. The method of claim 7, wherein said step of determining at least one of said power level (P) and said scan rate (S) uses a linear relationship between said scan rate (S) and said power level (P), a linear relationship between said scan rate (S) and said substrate thickness (T) and a linear relationship between said power level (P) and said substrate thickness (T) in determining at least one of said parameters.

16. A method of laser bonding a first conductive element and a second conductive element disposed in contact with said first conductive element and on a mounting surface of a substrate, said substrate comprising a conductive plane and a dielectric layer disposed between said conductive plane and said mounting surface, said method comprising the steps of:
  irradiating said first and second conductive elements with a continuous wave laser beam characterized by a power level (P), a beam diameter (B) and a scan rate (S) at which the beam moves relative to one of said first and second conductive elements;
  determining at least one of said power level (P), said beam diameter (B) and said scan rate (S) using a functional relationship between at least one of said parameters and a distance (D) between said conductive plane and said mounting surface of said substrate.

17. The method of claim 7, wherein said step of determining at least one of said beam diameter (B), said power level (P) and said scan rate (S) includes the step of using a linear relationship between said scan rate (S) and said distance (D) between said conductive plane and said mounting surface.

18. The method of claim 7, wherein said step of determining at least one of said beam diameter (B), said power level (P) and said scan rate (S) includes the step of using a linear relationship between said power level (P) and said distance (D) between said conductive plane and said mounting surface.

19. The method of claim 7, wherein said step of determining at least one of said beam diameter (B), said power level (P) and said scan rate (S) includes the step of using a quadratic formula expressing said distance (D) between said conductive plane and said mounting surface in terms of beam diameter (B).

20. The method of claim 7, wherein said step of determining at least one of said beam diameter (B), said power level (P) and said scan rate (S) includes the step of using a formula expressing said scan rate as a quadratic function of said beam diameter (B), and a linear function of said power level (P) and said distance (D) between said conductive plane and said mounting surface.

21. The method of claim 7, wherein said step of determining at least one of said power level (P) and said scan rate (S) uses a linear relationship between said scan rate (S) and said power level (P), a linear relationship between said scan rate (S) and said distance (D) and a linear relationship between said power level (P) and said distance (D) in determining said parameter.

22. The method of claim 7, wherein said step of determining at least one of said power level (P), said beam diameter (B) and said scan rate (S) includes the step of using an equation having a form $$S=aB^2+bB+cP+dD+e$$

where "a", "b", "c", "d", and "e" have predetermined values.

23. The method in accordance with claim 7, wherein said substrate comprises a printed circuit board, and said conductive plane comprises a voltage reference plane.

24. The method of claim 7, wherein said functional relationship is generally in the form:

$$S=-1777.78B^2+113.89B+0.87P-191.43T+2.96.$$

* * * * *